(12) United States Patent
Huang et al.

(10) Patent No.: US 10,900,493 B2
(45) Date of Patent: Jan. 26, 2021

(54) LUMINOUS FAN

(71) Applicant: Primax Electronics Ltd., Taipei (TW)

(72) Inventors: Wei-Chiang Huang, Taipei (TW); Wei-Ping Chan, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 179 days.

(21) Appl. No.: 16/363,529

(22) Filed: Mar. 25, 2019

(65) Prior Publication Data
US 2020/0240425 A1 Jul. 30, 2020

(30) Foreign Application Priority Data
Jan. 29, 2019 (TW) .............................. 108103338 A (51) Int. Cl.
| | |
|---|---|
| *F04D 29/00* | (2006.01) |
| *F21V 33/00* | (2006.01) |
| *F21V 8/00* | (2006.01) |
| *F04D 19/00* | (2006.01) |
| *G06F 1/20* | (2006.01) |
| *H05K 7/20* | (2006.01) |
| *F04D 25/06* | (2006.01) |

(52) U.S. Cl.
CPC ......... *F04D 29/005* (2013.01); *F04D 19/002* (2013.01); *F04D 25/0613* (2013.01); *F21V 33/0096* (2013.01); *G02B 6/0018* (2013.01); *G02B 6/0021* (2013.01); *G02B 6/0051* (2013.01); *G06F 1/20* (2013.01); *H05K 7/20172* (2013.01); *G06F 2200/201* (2013.01)

(58) Field of Classification Search
CPC .. F04D 19/002; F04D 25/0613; F04D 29/005; F21V 33/0096; F24F 13/078; G02B 6/0018; G02B 6/0021; G02B 6/0051; G06F 1/203; H05K 7/20172
See application file for complete search history.

(56) References Cited

U.S. PATENT DOCUMENTS

| | | | | |
|---|---|---|---|---|
| 6,790,003 | B1 * | 9/2004 | Hu ...................... | F04D 25/0613 415/118 |
| 7,029,247 | B2 * | 4/2006 | Huang .................... | F21S 9/04 361/688 |
| 10,585,463 | B1 * | 3/2020 | Huang .............. | G02B 19/0014 |
| 2019/0331122 | A1 * | 10/2019 | Chen ....................... | F04D 25/08 |
| 2020/0072231 | A1 * | 3/2020 | Huang .............. | F04D 25/0613 |
| 2020/0240425 | A1 * | 7/2020 | Huang .................... | G06F 1/181 |

* cited by examiner

*Primary Examiner* — J. Todd Newton
*Assistant Examiner* — Christopher R Legendre
(74) *Attorney, Agent, or Firm* — Kirton McConkie; Evan R. Witt (57) ABSTRACT

A luminous fan includes a fan frame, a main circuit board, a light guide element and a light-guiding impeller. The main circuit board is disposed on a bracket of the fan frame and includes a first light-emitting element. The light guide element is located over the main circuit board, and includes a light input surface and light output surface. A light guide post is disposed on the light input surface. A reflective structure is formed on the light output surface. The light-guiding impeller is pivotally coupled to the bracket. The first light-emitting element emits a first light beam. After the first light beam is transmitted to the reflective structure through the light guide post, the first light beam is reflected by the at least one reflective structure and diffused toward a middle region of the light guide element.

14 Claims, 6 Drawing Sheets

LUMINOUS FAN

FIELD OF THE INVENTION

The present invention relates to a fan, and more particularly to a luminous fan.

BACKGROUND OF THE INVENTION

In modern lives, desktop computers have become essential home appliances for small and medium-sized families. Generally, the host of the home computer is equipped with a cooling fan. The cooling fan is used for dissipating the heat from the casing of the host. Since the overheating problem is avoided, the processor, the motherboard or the hard drive in the host is not damaged.

For meeting the requirements or preferences of different users, a computer host with a transparent casing has been introduced into the market. The inner structure or condition within the computer host can be directly observed through the transparent casing. Moreover, the computer host may be further equipped with a luminous fan. When the computer host is turned on, the luminous fan emits a light beam and the luminous fan is operated to remove heat. Consequently, the computer host is operated stably and the appearance of the computer host becomes more modern.

Nowadays, the trends of designing the computer host or the electronic device are toward slimness and miniaturization. For achieving this purpose, the volume of the luminous fan needs to be reduced. Accordingly, the solid state light sources (e.g., light emitting diode) with small size and high luminous efficiency have been widely used in the illumination modules of various luminous fans.

However, the use of the solid state light source still has some drawbacks. For example, since the light beam from the solid state light source travels along a linear trajectory, the diffraction angle is small. As the volume of the luminous fan is reduced, the propagation path of the light beam is shortened and the projection area of the light beam is centralized. Since the brightness of the projected location of the light beam is not uniform, hot spots are generated at the projected location. Due to the generation of the hot spots, the luminous fan cannot provide the uniform luminous efficacy. For example, in case that a mark or symbol is formed on a hub or a blade of the luminous fan, the entire of the mark or symbol is not shown because of the hot spots. Consequently, the overall visual effect of the luminous fan is impaired.

For solving the drawbacks of the conventional technologies, the present invention provides a luminous fan for uniformly diffracting the light beam from a linear light source.

SUMMARY OF THE INVENTION

The present invention provides a luminous fan for uniformly diffracting the light beam from a linear light source.

In accordance with an aspect of the present invention, a luminous fan is provided. The luminous fan includes a fan frame, a main circuit board, a light guide element and a light-guiding impeller. The fan frame includes a bracket. The main circuit board is disposed on the bracket, and includes at least one first light-emitting element. The at least one first light-emitting element emits a first light beam. The light guide element is located over the main circuit board, and includes a light input surface and light output surface. At least one light guide post corresponding to the at least one first light-emitting element is disposed on the light input surface. The light output surface is opposed to the light input surface. Moreover, at least one reflective structure corresponding to the at least one light guide post is formed on the light output surface. The light-guiding impeller is pivotally coupled to the bracket, and includes a hub and plural blades. The light guide element is accommodated within the hub. The plural blades are circumferentially disposed on an outer surface of the hub. After the first light beam is transmitted to the at least one reflective structure through the at least one light guide post, the first light beam is reflected by the at least one reflective structure and diffused toward a middle region of the light guide element.

In an embodiment, the bracket includes a shaft coupling structure, and the hub includes a rotation shaft. The rotation shaft is pivotally coupled to the shaft coupling structure.

In an embodiment, the main circuit board has a first pivotal hole, and the shaft coupling structure is penetrated through the first pivotal hole.

In an embodiment, the luminous fan further includes a stator assembly and a rotator assembly. The stator assembly is located over the main circuit board. The rotator assembly is circumferentially disposed on an inner surface of the hub.

In an embodiment, the stator assembly has a second pivotal hole, and the shaft coupling structure is penetrated through the second pivotal hole.

In an embodiment, the stator assembly includes at least one opening corresponding to the at least one first light-emitting element.

In an embodiment, the at least one light guide post is penetrated through the at least one opening and aligned with the at least one first light-emitting element.

In an embodiment, the fan frame includes a ring-shaped frame body and a receiving recess. The receiving recess is enclosed by the ring-shaped frame body. The light-guiding impeller is accommodated within the receiving recess.

In an embodiment, the luminous fan further includes a light guide ring and a ring-shaped illumination module. The light guide ring is located beside an inner surface of the ring-shaped frame body and arranged around the light-guiding impeller. The ring-shaped illumination module is attached on the light guide ring.

In an embodiment, a ring-shaped groove and a light diffusion ring corresponding to the ring-shaped groove are located beside an inner surface of the ring-shaped frame body. The light guide ring and the ring-shaped illumination module are received within the ring-shaped groove. The light diffusion ring is coupled with the ring-shaped frame body to cover the ring-shaped groove.

In an embodiment, the light diffusion ring is made of a light-transmissible material or a light-guiding material.

In an embodiment, the ring-shaped illumination module includes a ring-shaped circuit board and at least one second light-emitting element. The at least one second light-emitting element is disposed on the ring-shaped circuit board.

In an embodiment, the light guide ring includes a ring-shaped light output surface, a reflective slant and an inner wall. The reflective slant is opposed to the ring-shaped light output surface. The inner wall is perpendicular to the ring-shaped light output surface. The inner wall is coupled with the ring-shaped circuit board.

In an embodiment, the inner wall has a concave structure corresponding to the reflective slant. The at least one second light-emitting element is disposed within the concave structure. The at least one second light-emitting element emits a second light beam. After the second light beam is transmitted to the reflective slant through the concave structure, the second light beam is reflected to the ring-shaped light output surface by the reflective slant.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
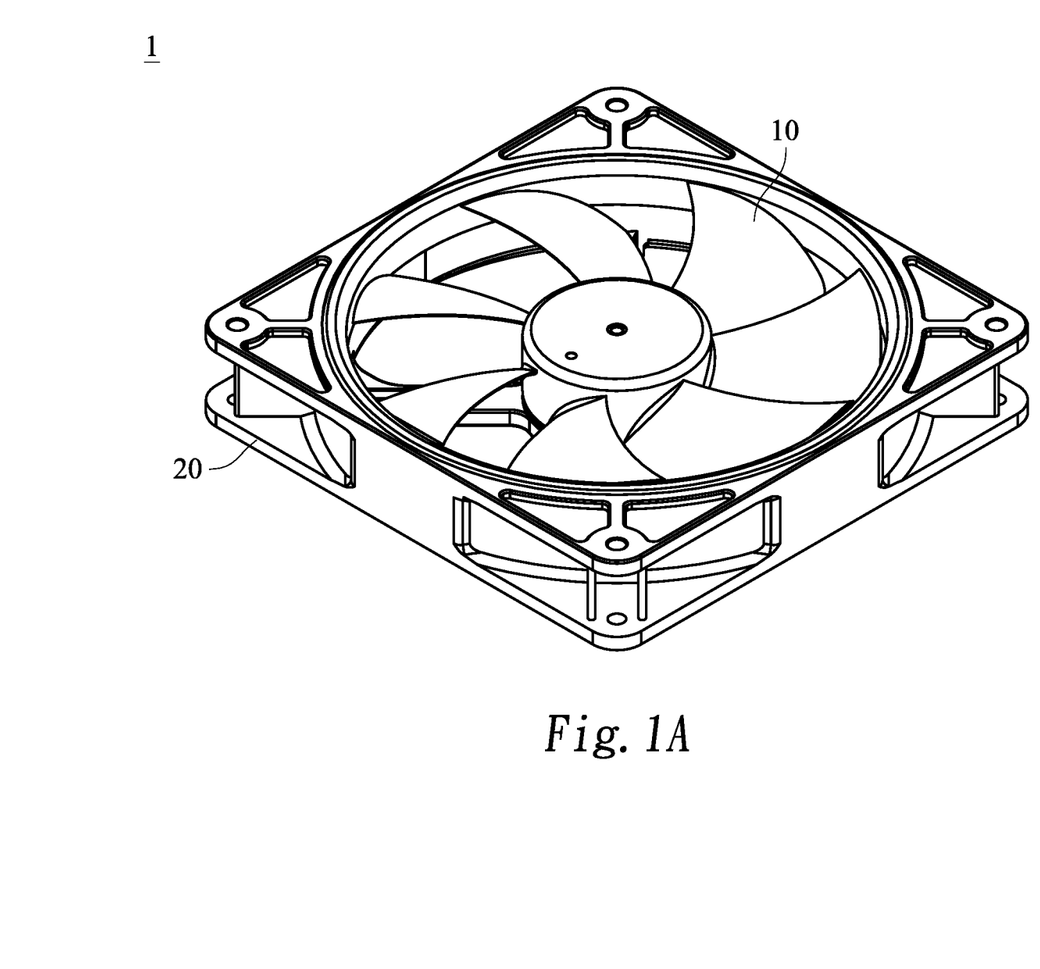
FIG. 1A is a schematic perspective view illustrating a luminous fan according to an embodiment of the present invention.
Figure 1B:
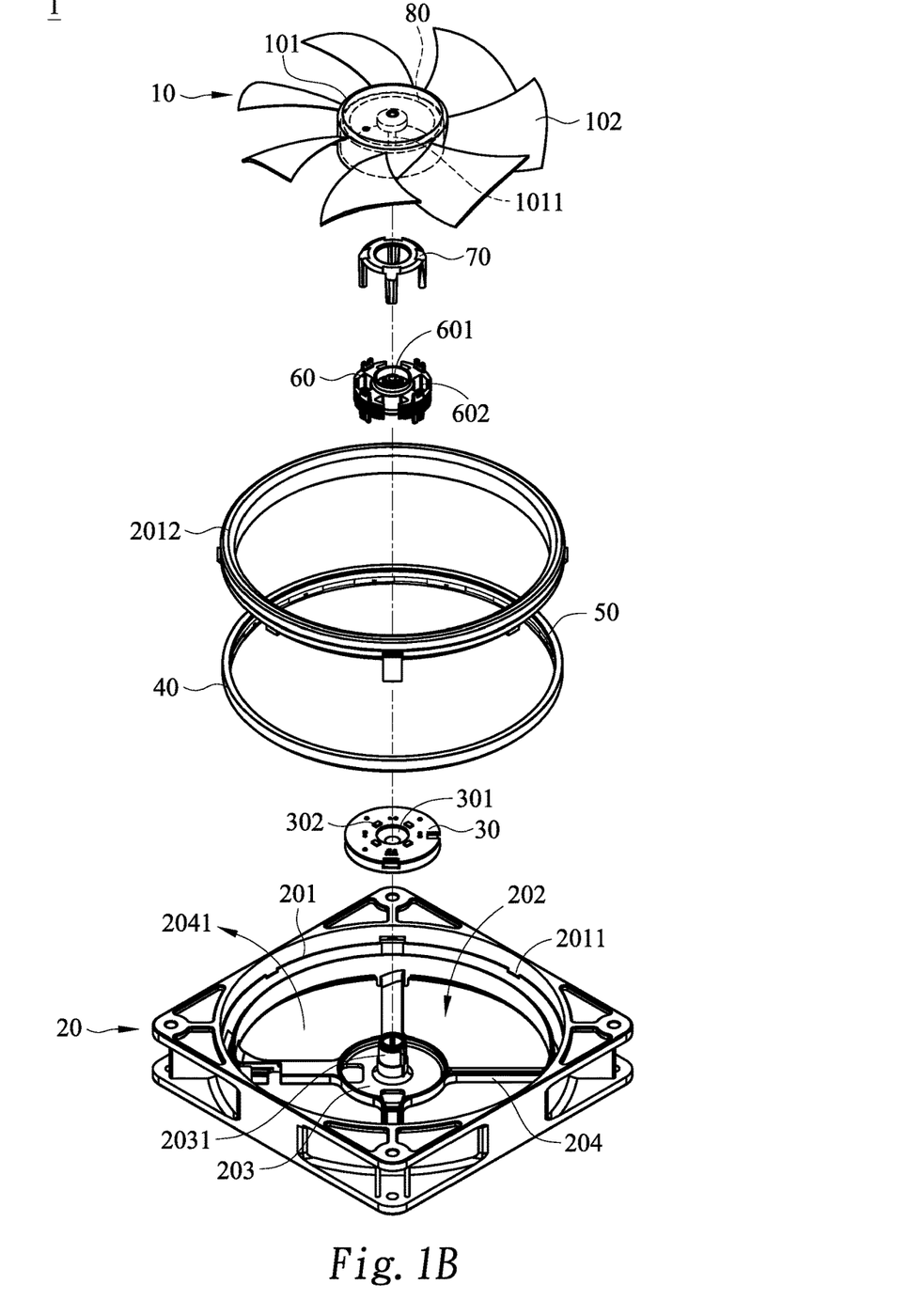
FIG. 1B is a schematic exploded view illustrating the luminous fan according to the embodiment of the present invention.

Please refer to FIGS. 1A and 1B. FIG. 1A is a schematic perspective view illustrating a luminous fan according to an embodiment of the present invention. FIG. 1B is a schematic exploded view illustrating the luminous fan according to the embodiment of the present invention. In this embodiment, the luminous fan 1 comprises a light-guiding impeller 10, a fan frame 20, a main circuit board 30, a light guide ring 40, a ring-shaped illumination module 50, a stator assembly 60, a light guide element 70 and a rotator assembly 80.

The light-guiding impeller 10 comprises a hub 101 and plural blades 102. The blades 102 are circumferentially disposed on an outer surface of the hub 101. A rotation shaft 1011 is disposed within the hub 101. The stator assembly 60 and the light guide element 70 are accommodated within the hub 101. The rotator assembly 80 is circumferentially disposed on an inner surface of the hub 101. Moreover, the rotator assembly 80 is rotatable relative to the stator assembly 60. In an embodiment, a mark or symbol (not shown) is formed on the hub 101 of the light-guiding impeller 10. Moreover, the hub 101 is made of a light-transmissible material or a light-guiding material such as polycarbonate (PC) or acrylic resin. Consequently, the light beam van be transmitted through the hub 101, and the mark or symbol on the hub 101 can be observed through the hub 101. In another embodiment, diffusion powder or phosphor powder is added to and mixed with the material of the hub 101 during the process of fabricating the light-guiding impeller 10. Consequently, the light-guiding efficacy or the illuminating efficacy of the light-guiding impeller 10 is increased.

In an embodiment, the material of the blade 102 does not have the light-transmissible/light-guiding property. Since the light beam is not leaked to the blades 102, the overall visual effect of the luminous fan 1 is not impaired. It is noted that the material of the blade 102 is not restricted. That is, the blade 102 may be made of the light-transmissible material or the light-guiding material according to the practical requirements of the user.

The fan frame 20 comprises a ring-shaped frame body 201, a receiving recess 202, a bracket 203 and plural ribs 204. The receiving recess 202 is enclosed by the ring-shaped frame body 201. The light-guiding impeller 10 is accommodated within the receiving recess 202. The bracket 203 is disposed within the receiving recess 202. The bracket 203 comprises a shaft coupling structure 2031. The bracket 203 is connected with the ring-shaped frame body 201 through the plural ribs 204. Moreover, plural ventilation holes 2041 are formed in the receiving recess 42 and partitioned by the plural ribs 204. Moreover, a ring-shaped groove 2011 and a light diffusion ring 2012 corresponding to the ring-shaped groove 2011 are located beside an inner surface of the ring-shaped frame body 201. The light guide ring 40 and the ring-shaped illumination module 50 are received within the ring-shaped groove 2011. The light diffusion ring 2012 is coupled with the ring-shaped frame body 201 to cover the top side of the ring-shaped groove 2011. Consequently, the light guide ring 40 and the ring-shaped illumination module 50 are arranged around the light-guiding impeller 10. In this embodiment, the light diffusion ring 2012 is also made of a light-transmissible material or a light-guiding material. After the light beam is exited from the light guide ring 40, the light beam is further diffused by the light diffusion ring 2012. Consequently, a ring of light with uniform brightness is formed around the light-guiding impeller 10.

Please refer to FIG. 1B again. The main circuit board 30 is disposed on the bracket 203. The main circuit board 30 comprises a first pivotal hole 301 and one or plural first light-emitting elements 302. The stator assembly 60 is located over the main circuit board 30 and electrically connected with the main circuit board 30. The stator assembly 60 comprises a second pivotal hole 601 and plural openings 602 corresponding to the first light-emitting elements 302. The main circuit board 30 is used for controlling and powering the first light-emitting elements 302 and the stator assembly 60 and driving the first light-emitting elements 302 to emit a first light beam. Moreover, the main circuit board 30 controls the power level of the stator assembly 60 in order to adjust the rotating speed of the light-guiding impeller 10. In an embodiment, the first light-emitting element 302 is packaged through an encapsulation process instead of using a casing. Consequently, the size and volume of the first light-emitting element 302 are reduced. In such way, the first light-emitting element 302 can be installed within a narrow space, and the light beam from the first light-emitting element 302 can be introduced into the elongated light guide structure. An example of the first light-emitting element 302 includes but is not limited to a light emitting diode (LED), an organic light emitting diode (OLED), a quantum dots light emitting diode (QLED) or an electroluminescence (EL) unit.

Figure 2:
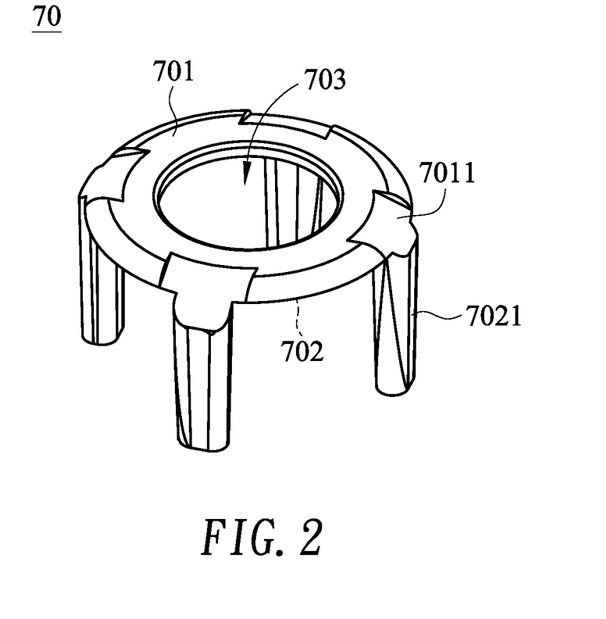
FIG. 2 is a schematic perspective view illustrating the light guide element of the luminous fan according to the embodiment of the present invention.

Please refer to FIG. 1B and FIG. 2. FIG. 2 is a schematic perspective view illustrating the light guide element of the luminous fan according to the embodiment of the present invention. The light guide element 70 is located over the main circuit board 30 and combined with the stator assembly 60. The light guide element 70 comprises a light output surface 701, a light input surface 702 and a third pivotal hole

703. The third pivotal hole 703 runs through the light output surface 701 and the light input surface 702.

After the shaft coupling structure 2031 is penetrated through the first pivotal hole 301, the second pivotal hole 601 and the third pivotal hole 703 sequentially, the shaft coupling structure 2031 is pivotally coupled to the rotation shaft 1011 of the hub 101. Consequently, the light-guiding impeller 10 is rotatable relative to the bracket 203.

Moreover, one or plural light guide posts 7021 are protruded from the light input surface 702 of the light guide element 70. The light guide posts 7021 are penetrated through the corresponding openings 602 of the stator assembly 60. Moreover, an end of each light guide post 7021 is in close contact with the corresponding first light-emitting element 302. Consequently, the first light beam from the corresponding first light-emitting element 302 can be received by the light guide post 7021 completely. The light output surface 701 is opposed to the light input surface 702. A reflective structure 7011 is formed on the light output surface 701 and aligned with the corresponding light guide post 7021. After the first light beam is transmitted to the light output surface 701 through the corresponding light guide post 7021, the first light beam is reflected by the reflective structure 7011 and diffused toward a middle region of the light guide element 70. Then, the first light beam is transmitted from the light output surface 701 to the hub 101 and outputted from the hub 101. In such way, the possibility of generating the hot spots is minimized. Consequently, the brightness of the hub 101 of the light-guiding impeller 10 is more uniform.

In the above embodiment, four light guide posts 7021 are protruded from the light input surface 702, and four reflective structures 7011 are formed on the light output surface 701. It is noted that the numbers and positions of the light guide posts 7021 and the reflective structures 7011 are not restricted. That is, the numbers and positions of the light guide posts 7021 and the reflective structures 7011 are determined according to the number and positions of the first light-emitting elements 302.

Figure 3A:
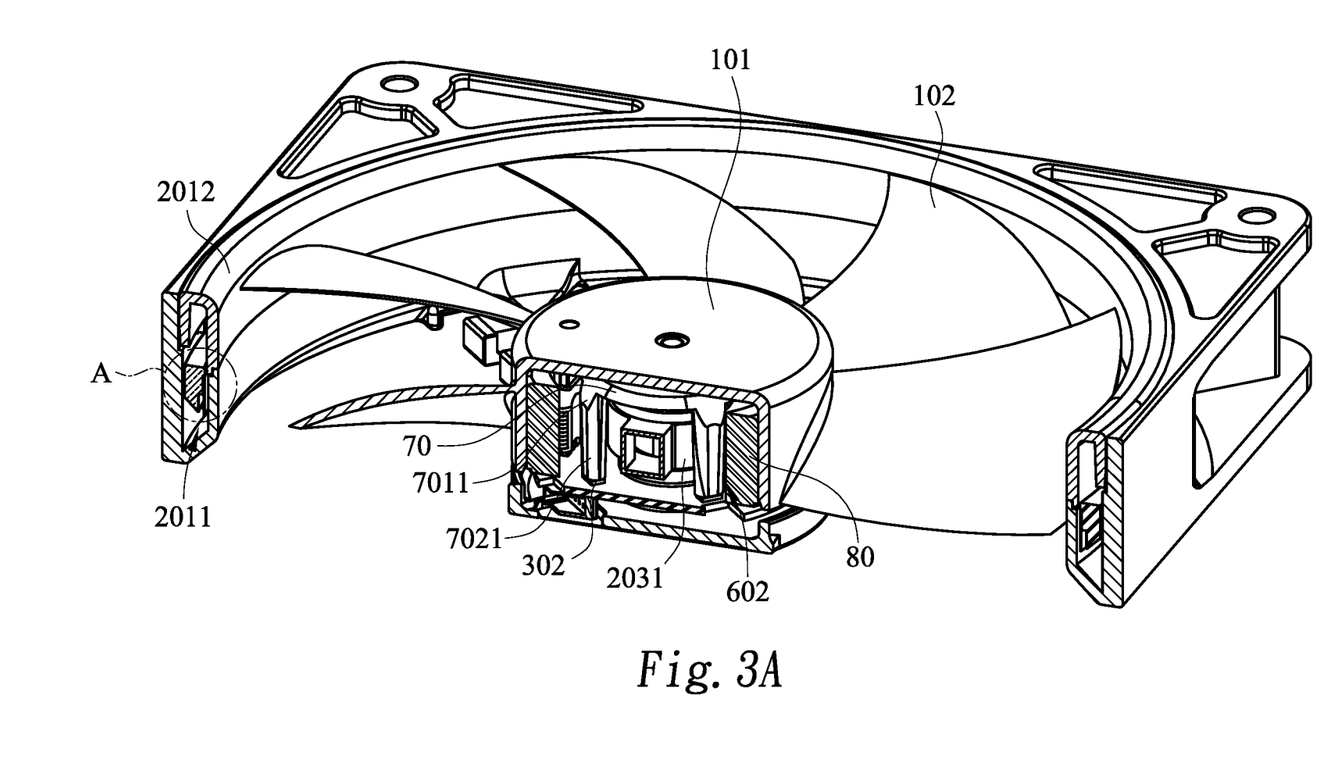
FIG. 3A is a schematic cutaway view illustrating the luminous fan according to the embodiment of the present invention.
Figure 3B:
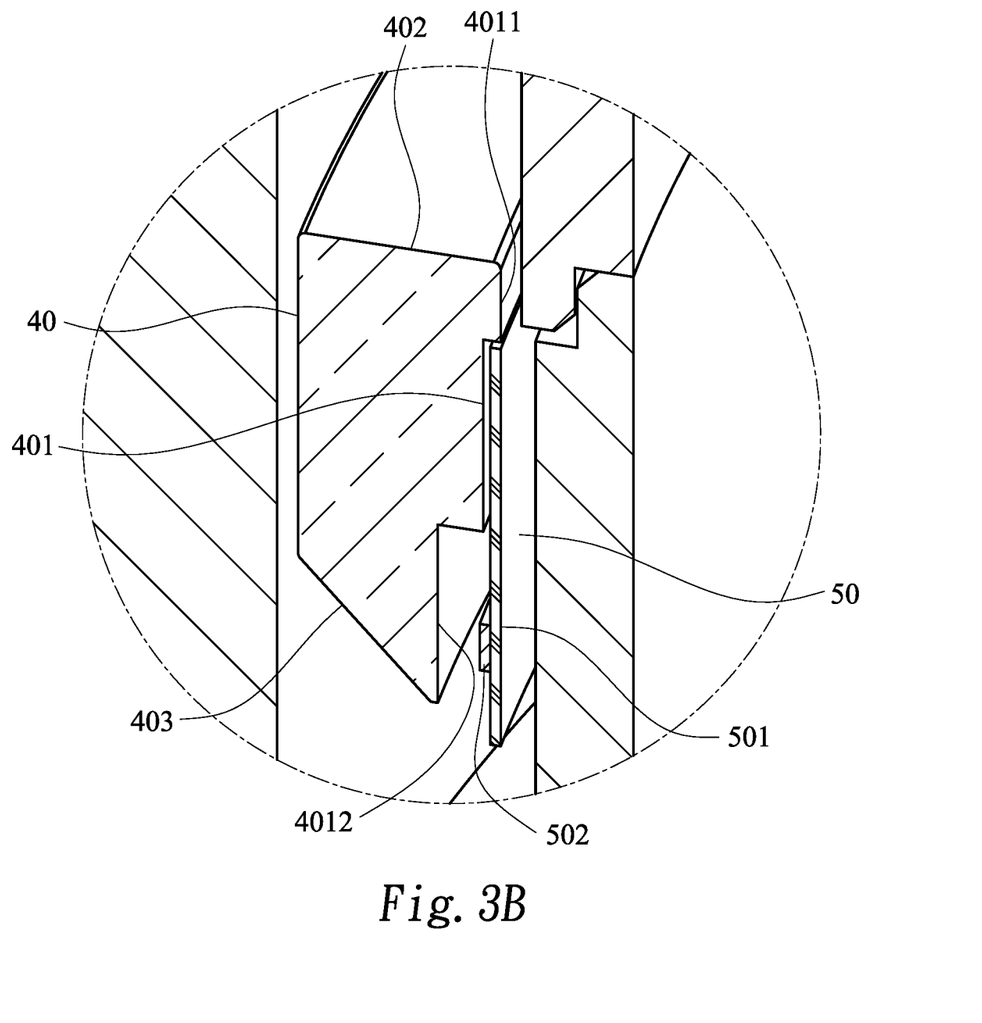
FIG. 3B is a schematic enlarged view of the region A as shown in FIG. 3A.

FIG. 3A is a schematic cutaway view illustrating the luminous fan according to the embodiment of the present invention. FIG. 3B is a schematic enlarged view of the region A as shown in FIG. 3A.

Please refer to FIG. 3A. The stator assembly 60 and the light guide element 70 are accommodated within the hub 101. The light guide posts 7021 of the light guide element 70 are penetrated through the corresponding openings 602 of the stator assembly 60. Moreover, an end of each light guide post 7021 is in close contact with the corresponding first light-emitting element 302. Consequently, the first light beam from the corresponding first light-emitting element 302 can be received by the light guide post 7021 completely. The light guide ring 40 and the ring-shaped illumination module 50 are received within the ring-shaped groove 2011. The light diffusion ring 2012 covers the top side of the ring-shaped groove 2011. The light beam exited from the light guide ring 40 is diffused by the light diffusion ring 2012.

Please refer to FIG. 3B. The light guide ring 40 comprises an inner wall 401, a ring-shaped light output surface 402 and a reflective slant 403. The reflective slant 403 is opposed to the ring-shaped light output surface 402. The inner wall 401 is perpendicular to the ring-shaped light output surface 402. The first side of the inner wall 401 is connected with the ring-shaped light output surface 402 and has a position-limiting protrusion edge 4011. The second side of the inner wall 402 has a concave structure 4012 corresponding to the reflective slant 403.

The ring-shaped illumination module 50 comprises a ring-shaped circuit board 501 and one or plural second light-emitting elements 502. The second light-emitting elements 502 are disposed on the ring-shaped circuit board 501. In an embodiment, the second light-emitting element 502 is packaged through an encapsulation process instead of using a casing. Consequently, the size and volume of the second light-emitting element 502 are reduced. An example of the second light-emitting element 502 includes but is not limited to a light emitting diode (LED), an organic light emitting diode (OLED), a quantum dots light emitting diode (QLED) or an electroluminescence (EL) unit. In this embodiment, the surface of the ring-shaped circuit board 501 with the second light-emitting element 502 is partially attached on the inner wall 401. A lateral edge of the ring-shaped circuit board 501 is contacted with the position-limiting protrusion edge 4011. Consequently, the relative positions between the ring-shaped circuit board 501 and the light guide ring 40 are fixed. The second light-emitting elements 502 are disposed within the concave structure 4012. Moreover, the second light-emitting elements 502 emit a second light beam.

Figure 4:
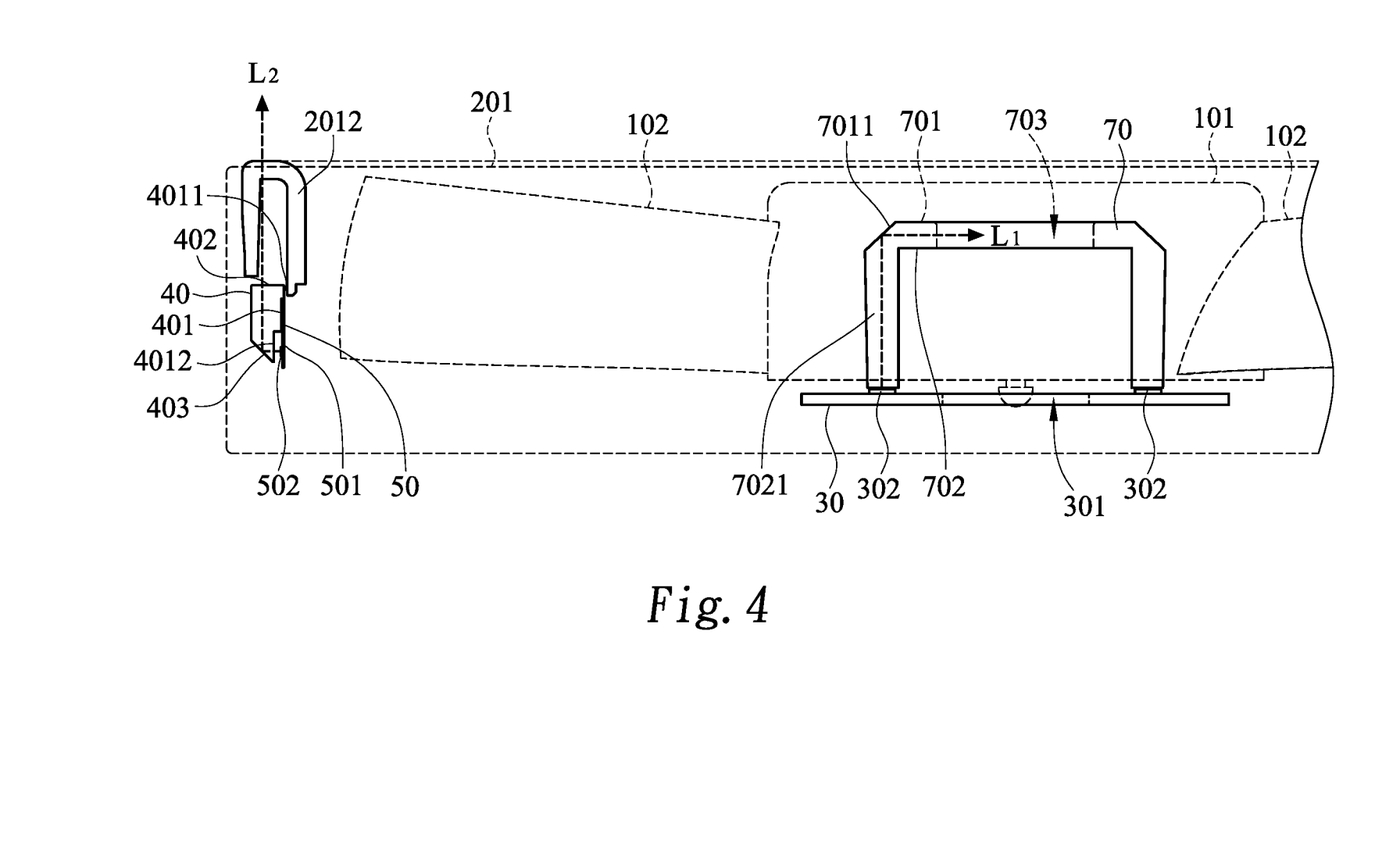
FIG. 4 schematically illustrates an illuminating condition of the luminous fan according to the embodiment of the present invention.

Please refer to FIG. 4. FIG. 4 schematically illustrates an illuminating condition of the luminous fan according to the embodiment of the present invention. The light guide element 70 is accommodated within the hub 101. An end of the each light guide post 7021 is in close contact with the corresponding first light-emitting element 302. The first light-emitting element 302 emits the first light beam L1. The first light beam L1 is transmitted to the reflective structure 7011 on the light output surface 701 through the light guide post 7021. Then, the first light beam L1 is reflected by the reflective structure 7011, and the first light beam L1 is diffused to the middle region of the light guide element 70. Then, the first light beam is transmitted from the light output surface 701 to the hub 101 and outputted from the hub 101. In such way, the brightness of the hub 101 is more uniform. Due to the arrangement of the light guide element 70, the light beam from the linear light source is not extremely centralized to the top side of the light source. Consequently, the possibility of generating the hot spots is effectively reduced. Under this circumstance, the mark or symbol (not shown) on the hub 101 can be shown in a more uniform manner.

In accordance with the present invention, the reflective structure 7011 has the partial reflection capability or the total reflection capability. In an embodiment, the reflective structure 7011 has the partial reflection capability. When the first light beam L1 is transmitted to the reflective structure 7011, a portion of the first light beam L1 is refracted and exited from the surface of the first light beam L1, and the rest of the first light beam L1 is reflected by the reflective structure 7011 and diffused to the middle region of the light guide element 70. In another embodiment, the reflective structure 7011 has the total reflection capability. When the first light beam L1 is transmitted to the reflective structure 7011, the entire of the first light beam L1 is reflected by the reflective structure 7011 and diffused to the middle region of the light guide element 70.

Please refer to FIG. 4 again. The second light-emitting element 502 emits the second light beam L2. The second light beam L2 is transmitted to the reflective slant 403 through the concave structure 4012. Then, the second light beam L2 is reflected by the reflective slant 403. Consequently, the second light beam L2 is reflected in the direction toward the ring-shaped light output surface 402. After the second light beam L2 is exited from the ring-shaped light output surface 402, the second light beam L2 is transmitted to the overlying light diffusion ring 2012. Then, the second light beam L2 is diffused by the light diffusion ring 2012. Consequently, the possibility of generating the hot spots is effectively reduced, and a ring of light with uniform brightness is formed around the light-guiding impeller 10. As mentioned above, the ring-shaped illumination module 50 is directly attached on the light guide ring 40. Since it is not necessary to retain a space of installing the ring-shaped illumination module 50, the overall volume or thickness of the fan frame 20 is reduced.

From the above descriptions, the present invention provides the luminous fan. The linear light beam from the light-emitting element can be uniformly diffused through the reflective structure of the light guide element. Consequently, the overall size and volume of the luminous fan are reduced, and the possibility of generating the hot spots is effectively reduced. In other words, the luminous fan of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A luminous fan, comprising:
   a fan frame comprising a bracket;
   a main circuit board disposed on the bracket, and comprising at least one first light-emitting element, wherein the at least one first light-emitting element emits a first light beam;
   a light guide element located over the main circuit board, and comprising a light input surface and a light output surface, wherein at least one light guide post corresponding to the at least one first light-emitting element is disposed on the light input surface, the light output surface is opposed to the light input surface, and at least one reflective structure corresponding to the at least one light guide post is formed on the light output surface, wherein the at least one guide post transmits the first light beam to the at least one reflective structure; and
   a light-guiding impeller pivotally coupled to the bracket, and comprising a hub and plural blades, wherein the light guide element is accommodated within the hub, and the plural blades are circumferentially disposed on an outer surface of the hub,
   wherein after the first light beam is transmitted to the at least one reflective structure through the at least one light guide post, the first light beam is reflected by the at least one reflective structure and diffused toward a middle region of the light guide element.

2. The luminous fan according to claim 1, wherein the bracket comprises a shaft coupling structure, and the hub comprises a rotation shaft, wherein the rotation shaft is pivotally coupled to the shaft coupling structure.

3. The luminous fan according to claim 2, wherein the main circuit board has a first pivotal hole, and the shaft coupling structure is penetrated through the first pivotal hole.

4. The luminous fan according to claim 2, further comprising a stator assembly and a rotator assembly, wherein the stator assembly is located over the main circuit board, and the rotator assembly is circumferentially disposed on an inner surface of the hub.

5. The luminous fan according to claim 4, wherein the stator assembly has a second pivotal hole, and the shaft coupling structure is penetrated through the second pivotal hole.

6. The luminous fan according to claim 4, wherein the stator assembly comprises at least one opening corresponding to the at least one first light-emitting element.

7. The luminous fan according to claim 6, wherein the at least one light guide post is penetrated through the at least one opening and aligned with the at least one first light-emitting element.

8. The luminous fan according to claim 1, wherein the fan frame comprises a ring-shaped frame body and a receiving recess, wherein the receiving recess is enclosed by the ring-shaped frame body, and the light-guiding impeller is accommodated within the receiving recess.

9. The luminous fan according to claim 8, further comprising a light guide ring and a ring-shaped illumination module, wherein the light guide ring is located beside an inner surface of the ring-shaped frame body and arranged around the light-guiding impeller, and the ring-shaped illumination module is attached to the light guide ring.

10. The luminous fan according to claim 9, wherein a ring-shaped groove and a light diffusion ring corresponding to the ring-shaped groove are located beside the inner surface of the ring-shaped frame body, wherein the light guide ring and the ring-shaped illumination module are received within the ring-shaped groove, and the light diffusion ring is coupled with the ring-shaped frame body to cover the ring-shaped groove.

11. The luminous fan according to claim 10, wherein the light diffusion ring is made of a light-transmissible material or a light-guiding material.

12. The luminous fan according to claim 9, wherein the ring-shaped illumination module comprises a ring-shaped circuit board and at least one second light-emitting element, wherein the at least one second light-emitting element is disposed on the ring-shaped circuit board.

13. The luminous fan according to claim 12, wherein the light guide ring comprises a ring-shaped light output surface, a reflective slant and an inner wall, wherein the reflective slant is opposed to the ring-shaped light output surface, the inner wall is perpendicular to the ring-shaped light output surface, and the inner wall is coupled with the ring-shaped circuit board.

14. The luminous fan according to claim 13, wherein the inner wall has a concave structure corresponding to the reflective slant, the at least one second light-emitting element is disposed within the concave structure, and the at least one second light-emitting element emits a second light beam, wherein the concave structure transmits the second light beam to the reflective slant, and wherein after the second light beam is transmitted to the reflective slant through the concave structure, the second light beam is reflected to the ring-shaped light output surface by the reflective slant.

* * * * *